(12) United States Patent
Kuo

(10) Patent No.: US 7,002,861 B2
(45) Date of Patent: Feb. 21, 2006

(54) MEMORY DEVICE FOR CONTROLLING PROGRAMMING SETUP TIME

(75) Inventor: Cheng-Hsiung Kuo, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 97 days.

(21) Appl. No.: 10/826,457

(22) Filed: Apr. 16, 2004

(65) Prior Publication Data

US 2005/0232048 A1    Oct. 20, 2005

(51) Int. Cl.
*G11C 7/00* (2006.01)

(52) U.S. Cl. .................................. 365/203; 365/189.07

(58) Field of Classification Search ................ 365/203, 365/201, 189.07, 230.06, 189.05
See application file for complete search history.

(56) References Cited

U.S. PATENT DOCUMENTS

| | | | | |
|---|---|---|---|---|
| 5,604,712 A | * | 2/1997 | Priebe .................... | 365/230.06 |
| 6,430,088 B1 | * | 8/2002 | Plants et al. ........... | 365/189.04 |
| 6,580,649 B1 | * | 6/2003 | Park ....................... | 365/189.07 |

* cited by examiner

*Primary Examiner*—Son T. Dinh
(74) *Attorney, Agent, or Firm*—Duane Morris LLP

(57) ABSTRACT

An improved memory device and the method for programming the same are disclosed. The memory device includes at least one memory block requiring a word line pre-charge time to be long enough to program one or more selected memory cells. A monitoring circuit is added for detecting one or more word lines to reach a predetermined threshold voltage to enable a predetermined high voltage to be supplied to one or more latches of the memory cells.

20 Claims, 6 Drawing Sheets

MEMORY DEVICE FOR CONTROLLING PROGRAMMING SETUP TIME

BACKGROUND OF INVENTION

The present invention relates generally to semiconductor devices, and more particularly to nonvolatile memory devices. Still more particularly, the present invention relates to methods for controlling program setup time for nonvolatile memory devices.

Nonvolatile memory devices such as flash memory and electrically-erasable-programmable-read-only memory (EEPROM) utilize a plurality of internal memory arrays that can be programmed to last indefinitely. Additional control circuitry is embedded in these devices for a number of purposes, including the control of the device's programming setup time and programming sequence. However, it is understood by those skilled in the art that the embedded circuitries and the methods by which the said circuitries are embedded may vary from time to time, depending on the desired functionality of the memory devices.

Typically, memory cells in a memory array are arranged along rows and columns. Memory cells are programmed by an effect called "tunneling", or the quantum-mechanical transmission of an electron to and from a floating gate through the oxide bandgap. A floating gate is a metal-oxide-semiconductor-field-effect transistor (MOSFET) gate lying between conduction channel and the usual MOSFET gate (control gate). Normally, only the control gate is electrically contacted. However, at low gate voltages the floating gate conducts the region between the conduction channel and the control gate. By exciting channel electrons and applying a large charge bias to the control gate, the floating gate will be charged and the threshold voltage of the transistor will be raised. Similarly, stored charges can be read electrically by detecting whether the threshold voltage has been raised. This detection can be performed through a source line (SL) latch. The presence of a charge bias determines the value ("1" or "0") of the memory cell, while the charging/detecting pair constitutes the write/read process of the memory cell.

Before a memory cell can be programmed, it must be initialized or erased, through the tunneling effect, to set each memory cell to a "1". After each memory cell is set to a "1", it is ready for programming. Before a nonvolatile memory cell is programmed, a specified programming voltage must be applied for a specified time. If the programming voltage is too low, or if the programming time is too short, the memory cells may not be programmed properly. Memory that is improperly initialized may slow down the cell sensor circuitry, which in turn slows down the read access time of the memory. In a worse scenario, data may be corrupted.

Current nonvolatile memory devices utilize a fixed programming setup time based upon the "worst-case" circuit propagation delays through the device. Typically, programming setup time uses a delay chain to define the program setup time. This programming setup time includes a word line pre-charge time and a word line discharge time. The word line pre-charge time must be long enough to ensure that all selected word lines are high enough to enable all SL latches corresponding to memory arrays. If the word line pre-charge time is not long enough, SL latches cannot be enabled because the selected word lines are not high enough. In order to prevent improper programming, the selected word lines must be ready at a word line voltage after the pre-charge time. If the word line discharge time is not long enough, selected word lines cannot discharge to target the word line voltage. Due to different memory array configurations, it is very difficult to design fixed word line pre-charge and discharge time periods. Also, although this "worst-case programming" setup time is calculated analytically, it does not represent the actual circuit dynamics. In other words, this "worst-case programming" setup method is not designed for variations in device-to-device fabrication processes, variations in device temperature setup, or variations in array configurations.

Desirable in the art of semiconductor memory design are additional methods with which better control of setup time of the programming of nonvolatile memory can be achieved.

SUMMARY

In view of the foregoing, this invention provides a method for controlling programming setup time for nonvolatile memory devices.

In one embodiment, the memory device includes at least one memory block requiring a word line pre-charge time to be long enough to program one or more selected memory cells. A monitoring circuit is added for detecting one or more word lines to reach a predetermined threshold voltage to enable a predetermined voltage to be supplied to one or more latches of the memory cells.

Various aspects and advantages will become apparent from the following detailed description, taken in conjunction with the accompanying drawings, illustrating the principles of the invention by way of embodiments.

DESCRIPTION

Figure 1:
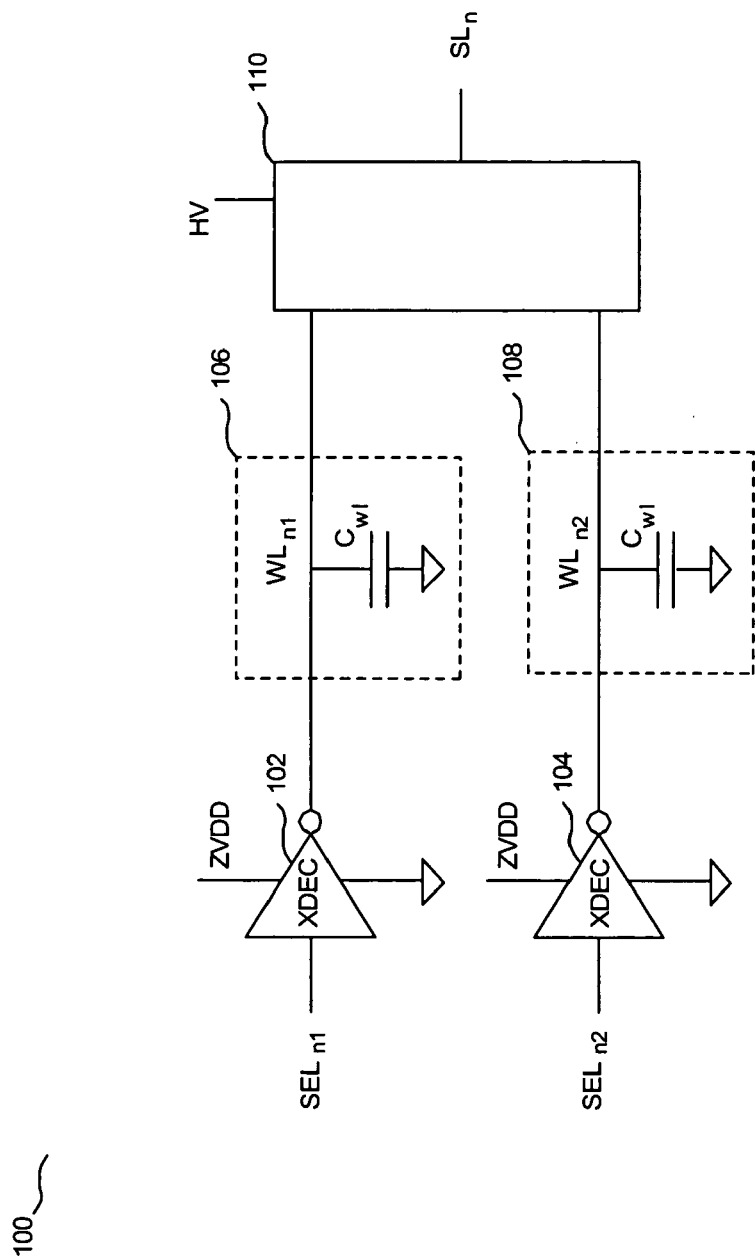
FIG. 1 illustrates an internal circuitry of a conventional memory array.

In the present invention, a memory device and a method to control program setup time thereof are disclosed. In FIG. 1, an internal circuitry of a conventional memory array 100 is presented. Memory array 100 includes two decoding (XDEC) inverters 102 and 104, two memory cells 106 and 108, and an SL latch 110, which has an output $SL_n$. The memory cells 106 and 108 further include two word lines $WL_{n1}$ and $WL_{n2}$, respectively. The XDEC inverters 102 and 104, which are both powered by ZVDD, have two inputs: $SEL_{n1}$ and $SEL_{n2}$, respectively. $SEL_{n1}$ and $SEL_{n2}$ are data select lines of the memory array 100 that are used to select the appropriate cells during programming. The outputs of the XDEC inverters 102 and 104 are respectively tied to the two word lines $WL_{n1}$ and $WL_{n2}$, which are further tied to the SL latch 110. Two capacitors $C_{w1}$ represent all memory cells along the word lines. The voltage level at the two word lines helps to define the state of the SL latch 110. Prior to programming, the voltages at the two word lines must be stable enough to insure proper SL latch operation, which in turn is necessary to ensure that the memory cells 106 and 108 will not be corrupted after programming. The time period needed to have the stable state of the word line is referred to as a pre-charge time of the word line. SL latch 110 is further connected to HV, a voltage source which may provide an operating voltage and a high voltage in different stages of the programming cycle that are necessary for programming the memory cells 106 and 108.

Figure 2:
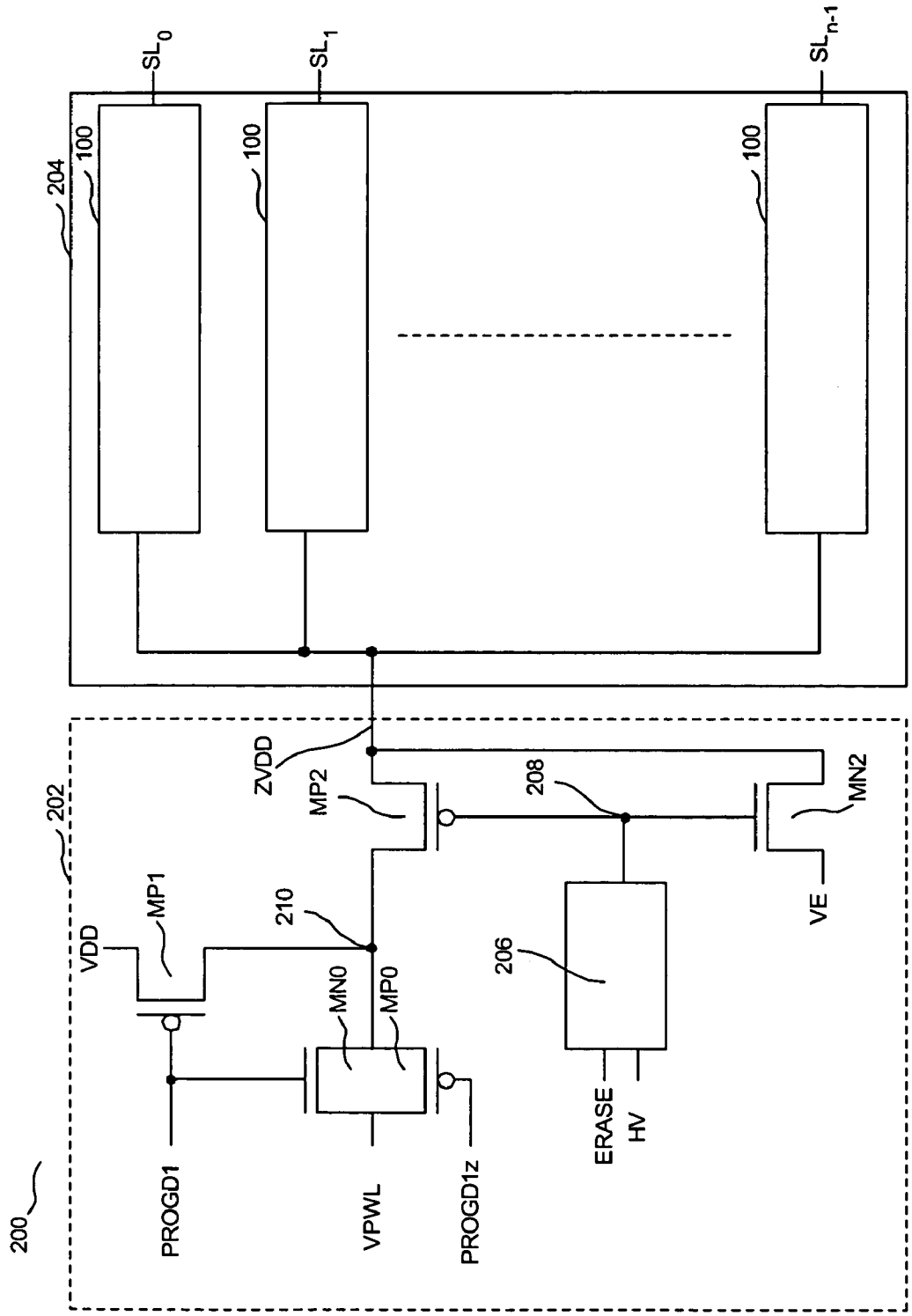
FIG. 2 illustrates a simplified internal circuitry of a conventional memory device.

FIG. 2 illustrates a simplified internal circuitry of a conventional memory device 200. With reference to both FIGS. 1 and 2, the memory device 200 includes a memory array power module 202 and a memory array block 204, which in turn includes a plurality of memory arrays (such as the one shown in FIG. 1 that give a plurality of source line outputs: $SL_0, SL_1 \ldots SL_{n-1}$. Memory array power module 202 gives an output ZVDD, which is the memory array power supply. Memory array power module 202 further includes an erase module 206, which has ERASE and high voltage HV as two inputs, and an output 208. During a program cycle, ERASE is set to "0", which causes the output 208 to be low.

With reference to both FIGS. 1 and 2, the device control logic initiates the programming sequence by setting PROGD1 to a "1" and PROGD1z to a "0", thereby turning on transistors MN0 and MP0 and passing VPWL to a node 210. If PROGD1 is set to a "0" and PROGD1z to a "1", MP1 is turned on, thereby sending VDD to node 210. If ERASE is set to "0", output 208 becomes low, thereby turning MP2 on and sending VPWL or VDD through node 210 to ZVDD. For the purpose of this invention, the power supply 202 offers the memory block two different voltage levels for the programming cycle, i.e., VPWL and VDD.

When ERASE is set to "1", a voltage builds up at output 208, thereby turning off MP2 and turning on MN2. When MP1 is turned off, VPWL is no longer passed to ZVDD. When MN2 is turned on, erase voltage VE is passed to ZVDD, thereby setting up XDEC inverters 102 and 104 of memory array 100 for erasing.

Figure 3:
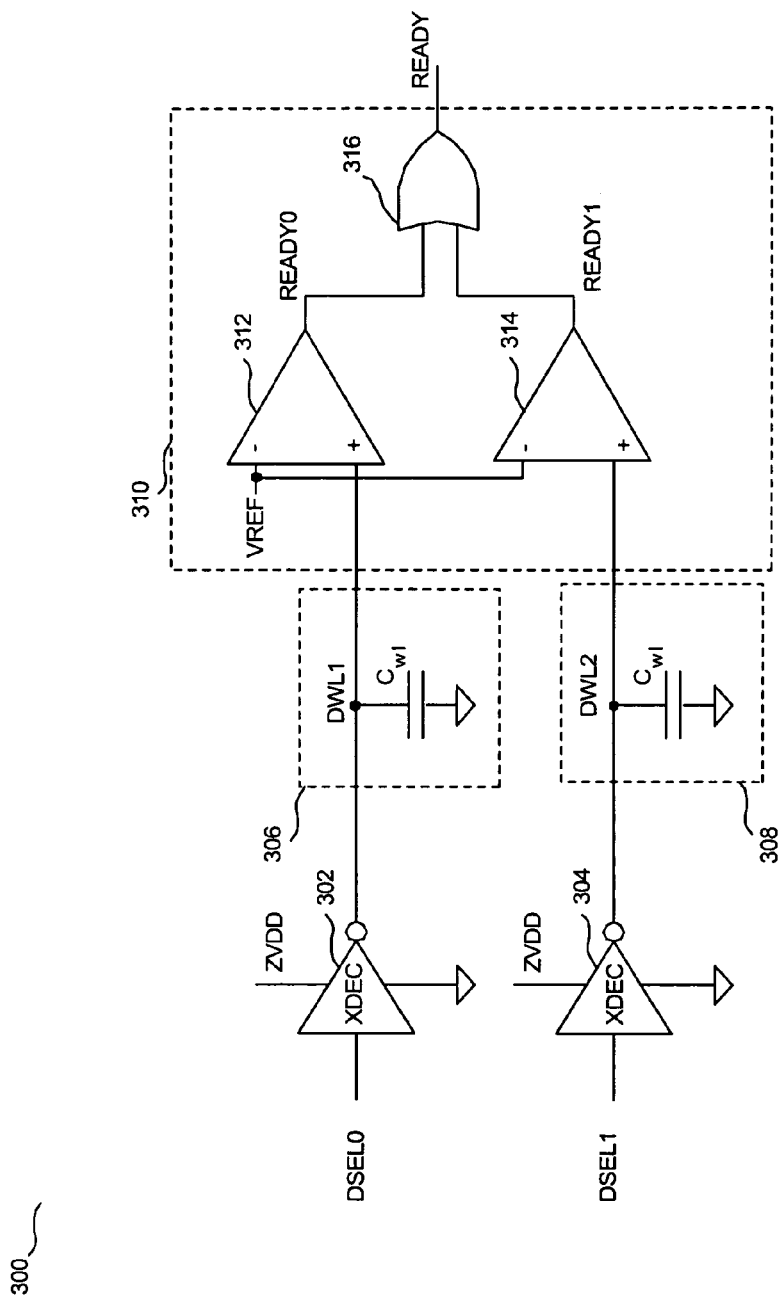
FIG. 3 illustrates a monitoring circuit in accordance with one embodiment of the present invention.

FIG. 3 illustrates a monitoring circuit 300 in accordance with one embodiment of the present invention. In one embodiment, the monitoring circuit 300 includes a combination of two monitoring circuit modules, each monitoring a single memory line. For embodiment, there are two "dummy" or test memory lines which have two XDEC inverters 302 and 304, two memory cells 306 and 308, and a word line detection circuit 310 (or a combination of two detection circuits each designed for one memory line). The word line detection circuit 310 includes two voltage comparators 312 and 314, and an OR gate 316, which has an output READY. The memory cells 306 and 308 further include two test word lines DWL1 and DWL2, respectively. The XDEC inverters 302 and 304, which are both powered by ZVDD, have two inputs: DSEL0 and DSEL1, respectively. The outputs of the XDEC inverters 302 and 304 are respectively tied to the two test word lines DWL1 and DWL2, which are further and respectively tied to two inputs of the two voltage comparators 312 and 314. Each of the two voltage comparators 312 and 314 is further tied to a voltage reference VREF. The voltage comparators 312 and 314 compare the word line voltages of the two test word lines against the voltage reference VREF. Finally, the two outputs, READY0 and READY1, of the two voltage comparators 312 and 314 are further tied to the OR gate 316 for generating the final output signal READY.

The memory cells associated with the monitoring circuit are structurally similar to other word lines so that the monitoring circuit tracks the test word line voltage, which represents a typical word line voltage in each of the memory rows. For embodiment, DSEL0 may monitor the even row of the memory block while DSEL1 may monitor the odd row. If either of the two test word line voltages reaches the preset reference voltage VREF, the output of the corresponding voltage comparator is set to a "1", thereby causing READY to set to a "1". It is understood that although the monitoring circuit shown in FIG. 3 has two "dummy lines" with the detection circuit 310 having two voltage comparators, it does not have to have two lines. For embodiment, a single line monitoring circuit can be used with only one voltage comparator for producing the READY (without using the OR gate 316) signal. This can be used for all the lines the memory block has.

The monitoring circuit 300 including the memory cell contained therein has a similar device structure as other word lines, and represents the worst case condition for word line voltage levels based on device physics, thereby ensuring that other word line voltages are equal to or greater than the test word line voltage when the test word line voltage has reached the reference voltage. In other words, the test word line rises slower than any other word line in voltage due to the nature of its device structure. If either of the two test word line voltages rise to the preset reference voltage level VREF, the monitoring circuit 300 indicates, through the output READY, the voltage at other word line circuits is sufficient enough to ensure that the corresponding SL latches to be in a stable state. As such, the end of the pre-charge time is defined by the READY signal from the monitoring circuit 300. This guarantees that all word lines are now ready to enter into a programming sequence, and allows the programming to occur without corrupting the memory cells by having an insufficient setup time.

Figure 4:
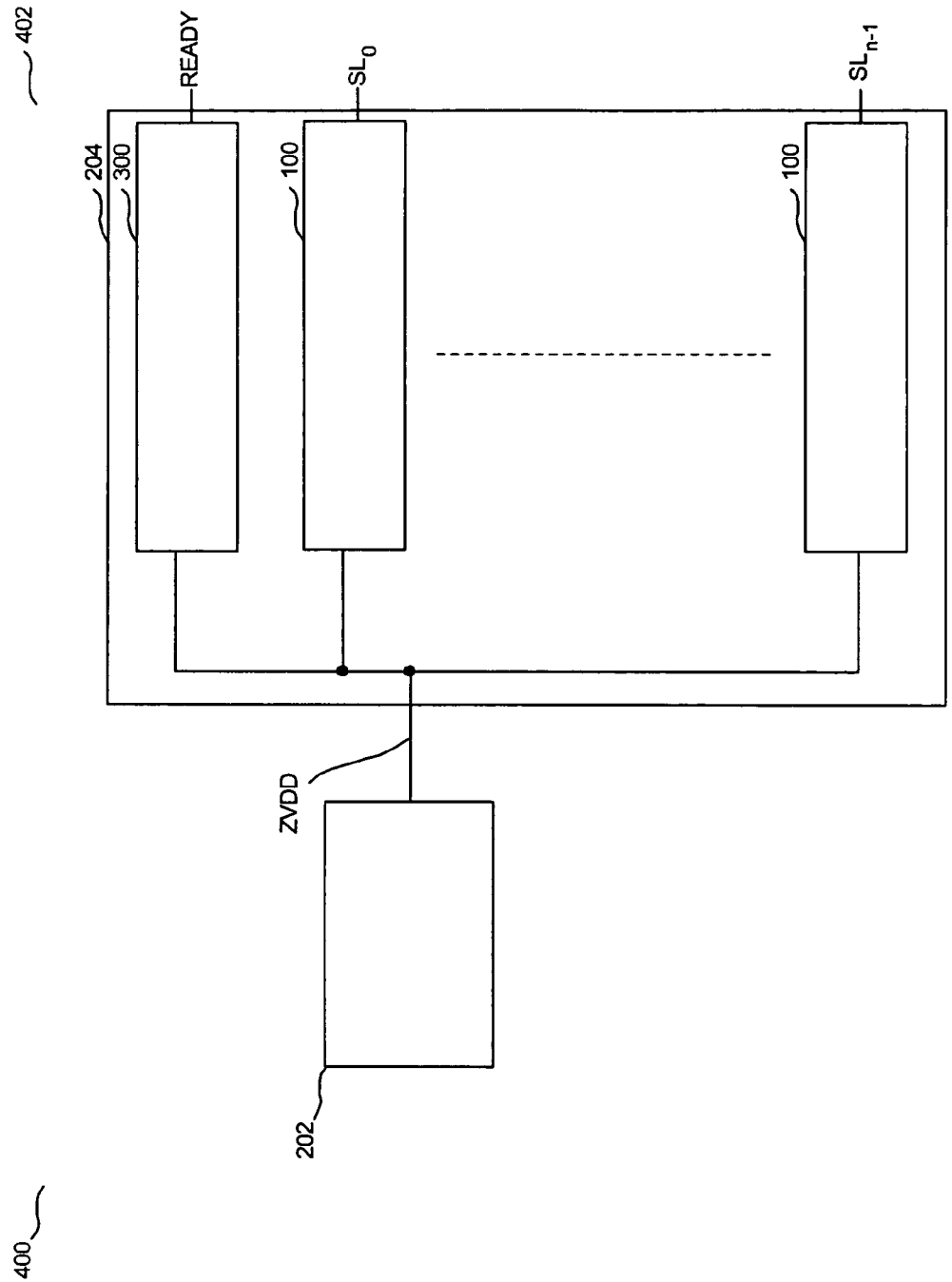
FIG. 4 illustrates a simplified internal circuitry of a memory device in accordance with one embodiment of the present invention.

FIG. 4 illustrates a simplified internal circuitry of a memory device 400 in accordance with one embodiment of the present invention. The memory device 400 includes a memory array power module 202, which is identical as the one shown in FIG. 2 and gives an output ZVDD, and a memory array block 204, which includes a plurality of memory arrays 100 that gives a plurality of source line outputs: $SL_0 \ldots SL_{n-1}$. The memory device 400 also includes a monitoring circuit 300, located at the top of the memory block 402, that gives a dummy output READY.

Figure 5:
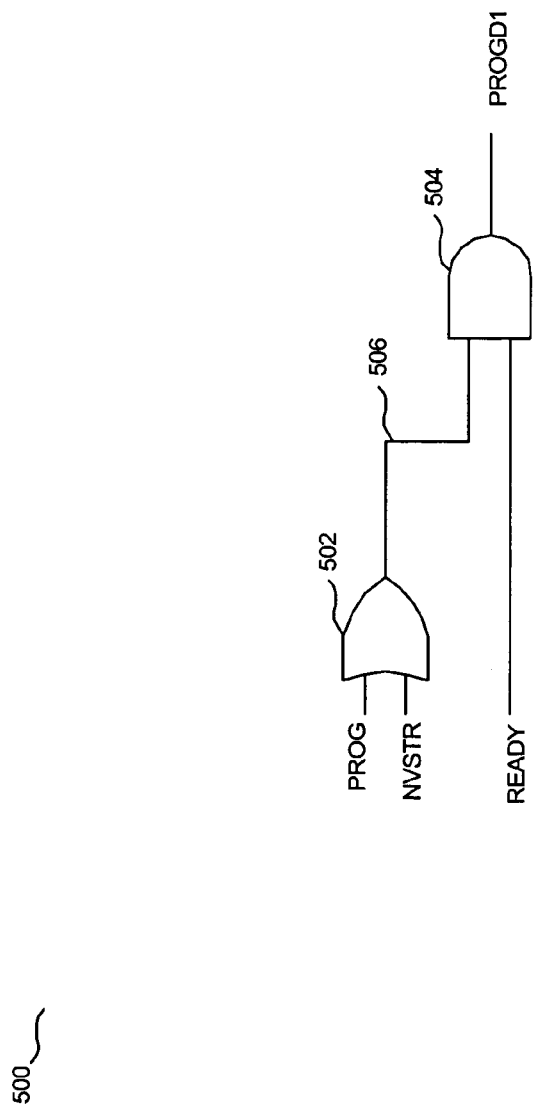
FIG. 5 illustrates an automatic compensation control circuitry in accordance with one embodiment of the present invention.

FIG. 5 presents a programming signal generation module 500 in accordance with one embodiment of the present invention. The module 500 includes an OR gate 502, which takes two inputs PROG and NVSTR, which indicate the beginning of a programming cycle and a phase of the program cycle in which a high voltage can be applied to the latches respectively. In one embodiment, these two signals produce an output or a programming triggering signal 506 through the OR gate 502. The module 500 also includes an AND gate 504, which takes the output 506 and the READY signal as inputs, and produces an output PROGD1, which indicates the earliest time point for applying a programming sequence. With reference to both FIGS. 3 and 5, the READY signal comes from the OR gate 316 and is fed as an input into the AND gate 504. If either PROG or NVSTR is set to a "1", thereby indicating that memory array programming sequence is to begin, the control module 500 generates a "1" at output 506. If READY signal is also at "1", PROGD1 is set to a "1", thereby indicating that programming sequence in the programming cycle may proceed. With reference to both FIGS. 2 and 5, the signal PROGD1 is fed in the memory device 200.

Figure 6:
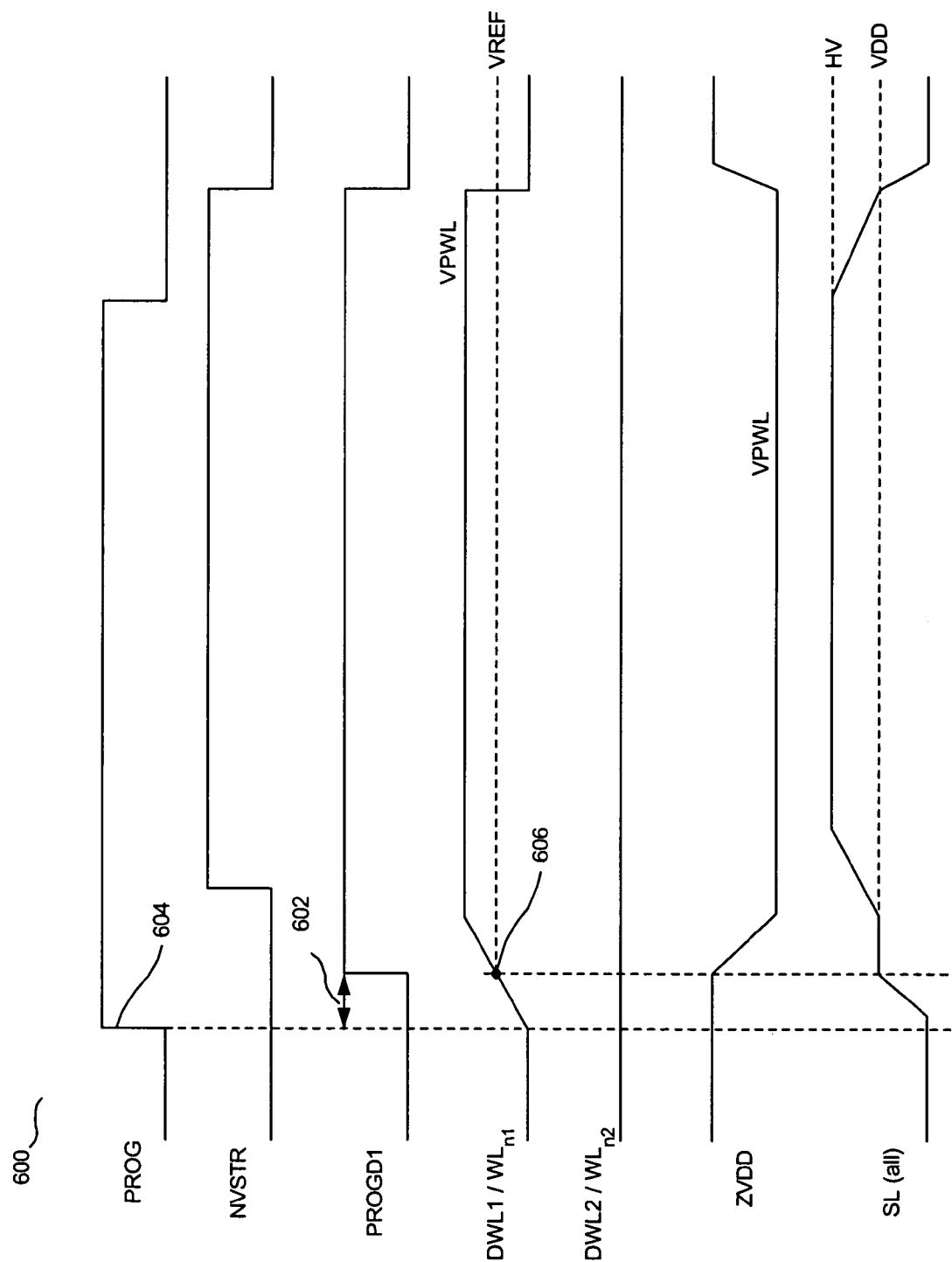
FIG. 6 illustrates a timing diagram of the memory device in accordance with one embodiment of the present invention.

FIG. 6 presents a timing diagram 600 that illustrates the timing relationships between device signals that control the programming setup time in accordance with one embodiment of the present invention. When PROG signal is set to a "1", the memory array programming sequence begins. As also described in FIGS. 2, 3, and 4, this starts the charging of the capacitor in each memory cell of the monitoring circuit and selected memory word lines of the memory block 204. When the voltage at test word line DWL1 rises to the preset voltage reference level VREF, the word line detection circuit 310 sets READY to a "1". When both the READY signal and either PROG or NVSTR signals are "1", PROGD1 is set to a "1", thereby indicating that programming sequence can begin. The program pre-charge time 602 is the time duration between the PROG rising edge, as indicated by a rising edge 604, and the point at which voltage at test word line DWL1 is equal to or greater than the reference voltage VREF, as indicated by a point 606.

As explained above, when PROGD1 stays low, VDD is provided to ZVDD, but when PROGD1 switches to high, ZVDD is supplied with VPWL. Before NVSTR is triggered, VDD is provided through HV to the latches, but after NVSTR is triggered, the high voltage HV is imposed on various source line outputs (SL). When the programming cycle is finished, PROGD1 goes low, and ZVDD goes back to VDD. In addition, the voltages on VPWL, HV, and VDD may vary depending on specific designs. For embodiment, in current practice, when the operating voltage VDD is at about 2.5V, VPWL is preferred to be at about 1.8V, and the higher voltage HV is at about 10.5V.

The improved memory device has the designed test word lines located with each memory block such as a memory page so that it is assured that any selected word line has a source line power high enough for the operation of the memory device. This design provides a flexible setup time for different memory device configurations. Further, there is no concern for the word line charging time being too short. This improved device has done away with the requirement that all word lines have to be uniform in their behavior, which is an impossible goal to reach.

The above invention provides many different embodiments, or embodiments, for implementing different features of the invention. Specific embodiments of components, and processes are described to help clarify the invention. These are, of course, merely embodiments and are not intended to limit the invention from that described in the claims.

Although illustrative embodiments of the invention have been shown and described, other modifications, changes, and substitutions are intended in the foregoing invention. Accordingly, it is appropriate that the appended claims be construed broadly and in a manner consistent with the scope of the invention, as set forth in the following claims.

What is claimed is:

1. A memory device comprising:
   at least one memory block requiring a word line pre-charge time to last long enough to program one or more memory cells associated with one or more selected word lines contained therein; and
   a monitoring circuit for detecting that each word line has reached a predetermined threshold voltage to enable a predetermined voltage to be supplied to one or more latches associated with the selected word lines.

2. The memory device of claim 1 wherein the monitoring circuit includes at least one memory cell structurally similar to memory cells of the selected word lines.

3. The memory device of claim 1 wherein the monitoring circuit is formed such that it needs the longest word line pre-charge time comparing to all selected word lines.

4. The memory device of claim 1 wherein the monitoring circuit includes at least one word line detection circuit for comparing the word line voltage with the threshold voltage.

5. The memory device of claim 1 wherein an output of the monitoring circuit is tied with a programming triggering signal of the memory device as two inputs to an AND gate for generating an output signal indicating that a programming sequence may proceed.

6. The memory device of claim 1 wherein the monitoring circuit includes two word line detection circuits each being connected to a memory block for detecting whether the word lines for either even or odd rows of the memory block have surpassed the threshold voltage.

7. A memory device comprising:
   at least one memory block requiring a word line pre-charge time to last long enough to program one or more selected memory cells associated with word lines contained therein;
   a first monitoring circuit for detecting a first test word line contained therein to reach a predetermined threshold voltage to enable a predetermined voltage to be supplied to a first set of selected memory cells; and
   a second monitoring circuit for detecting a second test word line contained therein to reach the predetermined threshold voltage to enable the predetermined voltage to be supplied to a second set of selected memory cells.

8. The memory device of claim 7 wherein the first and second monitoring circuits each includes one or more memory cells structurally similar to memory cells of the first and second set respectively.

9. The memory device of claim 8 wherein the first and second test word lines in the first or second monitoring circuit rise slower in voltage than the word lines associated with the first or second set of selected memory cells respectively when being charged.

10. The memory device of claim 7 wherein the first and second monitoring circuits includes a first and second word line detection circuits respectively for comparing the voltages of the first and second test word lines with the threshold voltage.

11. The memory device of claim 10 wherein the first and second word line detection circuits each generates an output signal indicating that the selected memory cells can be provided with the predetermined voltage for programming same.

12. A method for controlling a memory device, the memory device having at least one memory block having a plurality of memory cells associated with a plurality of word lines, the method comprising:
   providing a first signal initiating a programming cycle;
   generating a second signal from a monitoring circuit indicating that a programming sequence can be initiated for one or more selected word lines; and
   providing a predetermined high voltage to one or more source lines associated with the selected word lines after recognizing the second signal,
   wherein the monitoring circuit contains structurally similar memory cells as those in the selected word lines and has the longest pre-charge time among all.

13. The method of claim 12 further comprising providing a third signal indicating a beginning of imposing the pre-determined high voltage.

14. The method of claim 12 wherein the generating further includes detecting whether one or more test word lines in the monitoring circuit have reached a voltage level higher than a predetermined threshold voltage.

15. The method of claim 12 wherein the generating further includes detecting whether a test word line in the monitoring circuit has reached a voltage level higher than a predetermined threshold voltage to indicate all selected even or odd word lines have reached the voltage level.

16. The method of claim 12 further comprising providing a first operating voltage to the memory cells of the selected word lines prior to the programming sequence.

17. The method of claim 16 further comprising providing a second operating voltage after the pre-charge time.

18. The method of claim 17 wherein the first operating voltage is about 2.5V.

19. The method of claim 17 wherein the second operating voltage is about 1.8V.

20. The method of claim 17 wherein the predetermined high voltage is about 10.5V.

* * * * *